(12) United States Patent
Yiang et al.

(10) Patent No.: US 8,501,504 B2
(45) Date of Patent: Aug. 6, 2013

(54) METHOD AND SYSTEM FOR NON-DESTRUCTIVE DETERMINATION OF DIELECTRIC BREAKDOWN VOLTAGE IN A SEMICONDUCTOR WAFER

(75) Inventors: Kok Yong Yiang, Santa Clara, CA (US); Rick Francis, Sunnyvale, CA (US); Amit P. Marathe, Sunnyvale, CA (US); Van-Hung Pham, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 264 days.

(21) Appl. No.: 12/291,738

(22) Filed: Nov. 12, 2008

(65) Prior Publication Data
US 2010/0117676 A1 May 13, 2010

(51) Int. Cl.
*H01L 21/66* (2006.01)

(52) U.S. Cl.
USPC .............................. 438/17; 324/658; 324/663

(58) Field of Classification Search
USPC .................. 438/17, 18; 324/754, 765, 158.1, 324/658, 663
See application file for complete search history.

(56) References Cited

U.S. PATENT DOCUMENTS

| | | | | |
|---|---|---|---|---|
| 7,312,625 B1 * | 12/2007 | Paak et al. | ...................... | 324/770 |
| 2008/0228415 A1 * | 9/2008 | Ladbrooke et al. | ............. | 702/65 |
| 2008/0290889 A1 * | 11/2008 | Hillard | .......................... | 324/765 |

FOREIGN PATENT DOCUMENTS

JP 2002-100663 * 9/2000

OTHER PUBLICATIONS

Translation of JP2002-100663.*

* cited by examiner

*Primary Examiner* — Shaun Campbell
(74) *Attorney, Agent, or Firm* — Farjami & Farjami LLP (57) ABSTRACT

According to one exemplary embodiment, a non-destructive method for determining a breakdown voltage of a dielectric layer on a semiconductor substrate includes injecting a test current in increasing ramp steps into the dielectric layer. The method further includes measuring a test voltage across the dielectric layer at each increasing ramp step of the test current. The method further includes detecting a dropped test voltage in response to the increasing ramp steps of the test current. The ramp steps of the test current can be substantially logarithmically increased. The breakdown voltage of the dielectric layer can be designated to be substantially equal to the dropped test voltage.

18 Claims, 8 Drawing Sheets

METHOD AND SYSTEM FOR NON-DESTRUCTIVE DETERMINATION OF DIELECTRIC BREAKDOWN VOLTAGE IN A SEMICONDUCTOR WAFER

TECHNICAL FIELD

The present invention is generally in the field of semiconductor fabrication. More particularly, the invention is in the field of dielectric reliability testing on semiconductor wafers.

BACKGROUND ART

During semiconductor wafer fabrication, integrated circuits (ICs) that are formed on the wafer utilize layers of dielectric material, such as silicon dioxide, to provide insulation between adjacent metal segments and layers on the wafer. For example, an inter-level dielectric layer can be utilized to insulate adjacent metal layers on the wafer, while an intra-level dielectric layer can be utilized to insulate adjacent metal segments that are formed in a metal layer. However, breakdown of a dielectric layer in an IC can cause the IC to fail. Consequently, it is important for semiconductor manufacturers to conduct dielectric reliability testing during wafer fabrication. Dielectric reliability testing typically includes determining dielectric breakdown voltage, which indicates how much voltage can be applied across a dielectric layer before it breaks down.

Conventionally, dielectric breakdown voltage can be determined by utilizing a voltage ramp method, which includes applying a linearly increasing test voltage across a dielectric layer in a wafer while monitoring leakage current through the dielectric layer. The dielectric layer can be situated in, for example, a test structure formed in a dicing street on the wafer. In the conventional voltage ramp method, the test voltage is typically ramped up until an abrupt change in leakage current is detected, which indicates a breakdown of the dielectric layer. When the abrupt change in leakage current is detected, the corresponding value of the test voltage can represent the breakdown voltage of the dielectric layer.

However, in the conventional voltage ramp method, the breakdown of the dielectric layer typically results in a catastrophic failure of the dielectric layer, which causes a burn mark in the dicing street on the wafer. As a result of uncertainty as to whether the wafer has been contaminated by debris associated with the burn mark, the wafer has to be scrapped. Thus, although the conventional voltage ramp method can be utilized to determine a breakdown voltage of a dielectric layer, the catastrophic breakdown of the dielectric layer that occurs in the conventional voltage ramp method results in the wafer being scrapped, which undesirably increases manufacturing cost.

SUMMARY

A method and system for non-destructive determination of dielectric breakdown voltage in a semiconductor wafer, substantially as shown in and/or described in connection with at least one of the figures, and as set forth more completely in the claims.

DETAILED DESCRIPTION OF THE INVENTION

The present invention is directed to a method and system for non-destructive determination of dielectric breakdown voltage in a semiconductor wafer. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

Figure 1:
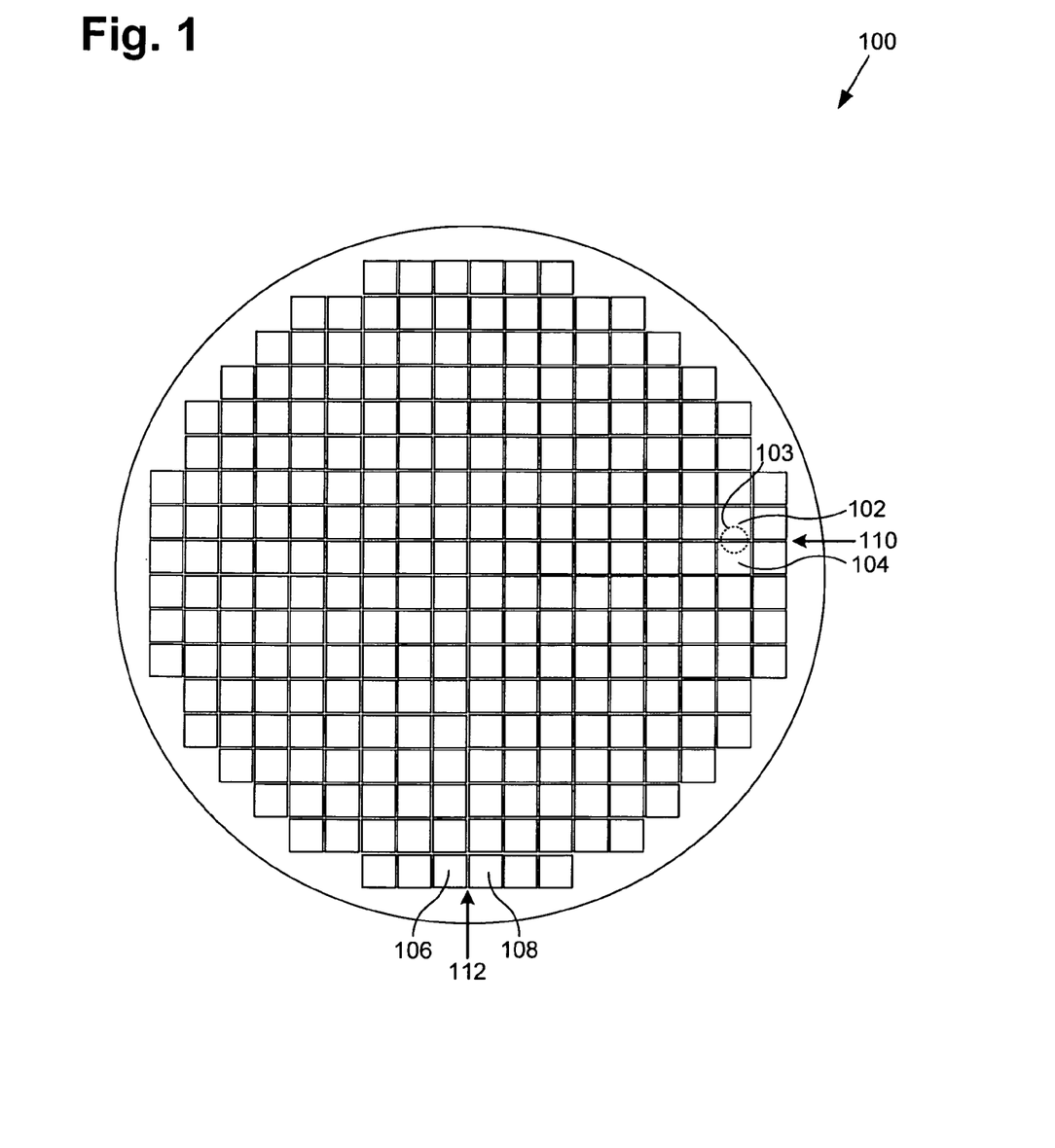
FIG. 1 shows a top view of an exemplary semiconductor wafer including exemplary semiconductor dies and dicing streets.

FIG. 1 shows a top view of an exemplary semiconductor wafer (also referred to simply as a "wafer") including exemplary semiconductor dies and dicing streets. Wafer 100, which is a semiconductor wafer, includes a number of semiconductor dies (hereinafter referred to simply as "dies"), such as dies 102, 104, 106, and 108, and a number of dicing streets, such as dicing streets 110 and 112. In wafer 100, a dicing street, such as dicing streets 110 and 112, can be formed between each row and each column of dies to provide a path along which the wafer can be sawed in a saw singulation process to separate the dies. Wafer 100 can be, for example, a "product" wafer, wherein each die on the wafer is intended to be packaged and sold as a "product" after being separated in the saw singulation process. In one embodiment, wafer 100 can be a test wafer. It is noted that only dies 102, 104, 106, and 108 and dicing streets 110 and 112 in FIG. 1 are discussed herein to preserve brevity.

As shown in FIG. 1, dicing street 110 is situated between dies 102 and 104 and dicing street 112 is situated between dies 106 and 108. Each dicing street can include a plurality of test pads (not shown in FIG. 1) and a plurality test structures (not shown in FIG. 1), where each test structure can underlie and be electrically connected to a pair of test pads. The test structures are situated over a semiconductor substrate (not shown in FIG. 1) in wafer 100. In one embodiment of the invention, the test structures can be situated over a semiconductor substrate in a die, such as die 102 or die 103. In one embodiment, the test structures can be situated over a semiconductor substrate in a singulated die. The test pads (not shown in FIG. 1) can be arranged in groups, where each group of test pads and associated test structures can be utilized for a particular test purpose, such as determining dielectric breakdown voltage. For example, one pair of test pads and an associated test structure can be utilized for determining dielectric breakdown voltage of an inter-level dielectric layer, i.e., a dielectric layer situated between adjacent metal layers (not shown in FIG. 1) in wafer 100. For example, another pair of test pads and an associated test structure can be utilized for determining dielectric breakdown voltage of an intra-level dielectric layer, i.e., a dielectric layer situated between adjacent metal lines or segments (not shown in FIG. 1) in a metal layer in wafer 100.

Figure 2:
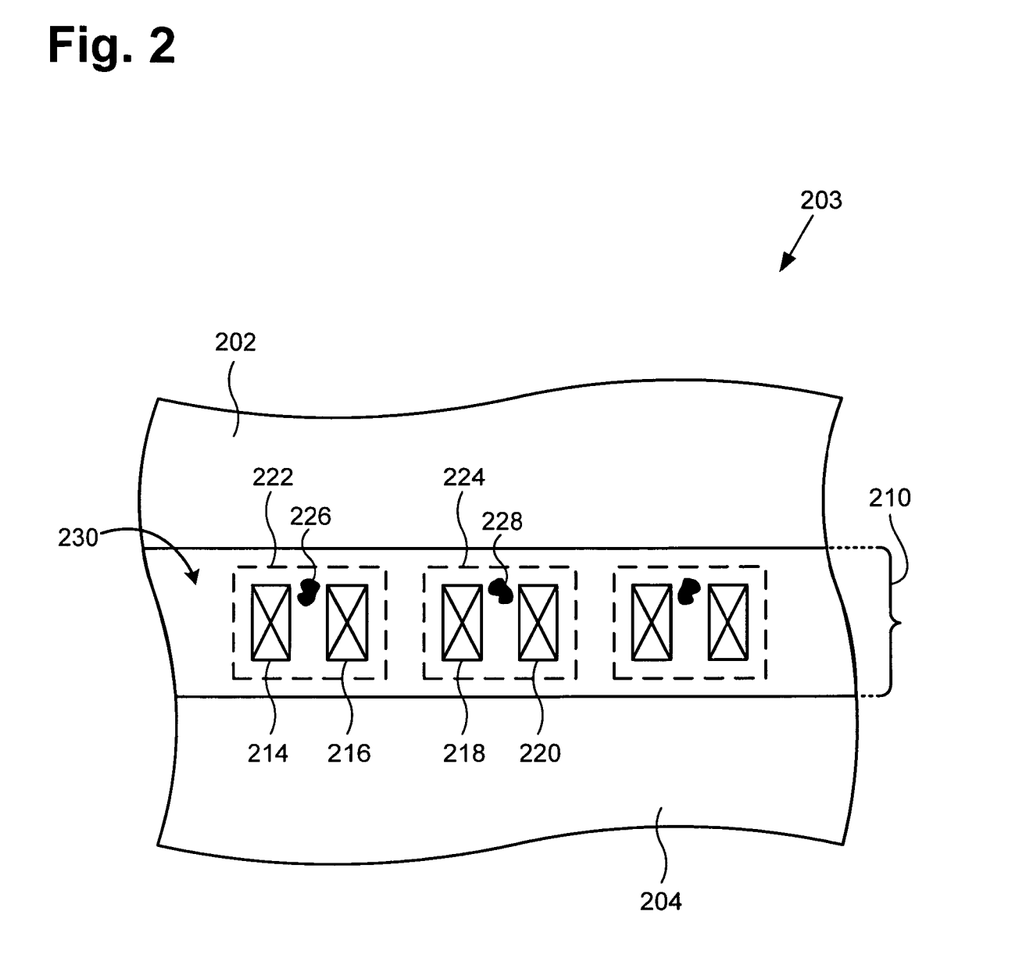
FIG. 2 shows a top view of a portion of the exemplary semiconductor wafer of FIG. 1 after dielectric breakdown voltage has been determined by an exemplary conventional voltage ramp method.

FIG. 2 shows a top view of a portion of wafer 100 in FIG. 1 after performing dielectric integrity testing utilizing a conventional voltage ramp dielectric breakdown method (hereinafter referred to simply as a "conventional voltage ramp method"). In FIG. 2, wafer portion 203 corresponds to the portion of wafer 100 indicated by dashed line 103 in FIG. 1. In particular, dies 202 and 204 and dicing street 210 in FIG. 2 correspond, respectively, to dies 102 and 104 and dicing street 110 in FIG. 1. Dicing street 210 includes test pads 214, 216, 218, and 220, test structures 222 and 224, and burn marks 226 and 228. It is noted that only test pads 214, 216, 218, and 220, test structures 222 and 224, and burn marks 226 and 228 in FIG. 2 are discussed herein to preserve brevity.

As shown in FIG. 2, test pads 214, 216, 218, and 220 are situated on surface 230 of wafer portion 203 and test structures 222 and 224 are situated below surface 230 of the wafer in dicing street 210. Test pads 214 and 216 can be electrically connected to test structure 222 and test pads 218 and 220 can be electrically connected to test structure 224. Test pads 214, 216, 218, and 220 can each comprise copper, aluminum, or other suitable metal or metal stack. Test structure 222 can be utilized, for example, for determining inter-level dielectric breakdown voltage and can include a dielectric layer (not shown in FIG. 2) situated between metal segments (not shown in FIG. 2) in dicing street 210 wafer portion 203. The metal segments in test structure 222 can be situated in adjacent metal layers (not shown in FIG. 2) in wafer 100 and can each be electrically connected to one of test pads 214 and 216.

Test structure 224 can be utilized, for example, for determining intra-level dielectric breakdown voltage in wafer portion 203 and can include a dielectric layer (not shown in FIG. 2) situated between adjacent metal segments (not shown in FIG. 2), which can be situated in a metal layer in the wafer. Each metal segment in test structure 224 can be electrically connected to one of test pads 218 and 220. Also shown in FIG. 2, burn marks 226 and 228 are situated on surface 230 of portion 203 of wafer 100 and also situated over respective test structures 222 and 224. Burn marks 226 and 228 are formed on surface 230 in dicing street 210 as a result of a catastrophic failure of a dielectric layer that can occur by utilizing a conventional voltage ramp method to determine dielectric breakdown voltage.

In the conventional voltage ramp method, a breakdown voltage of a dielectric layer in a test structure, such as test structure 222, that is connected to a pair of test pads, such as test pads 214 and 216, can be determined by applying a voltage ramp (i.e. an increasing voltage) to one test pad (e.g. test pad 214) and connecting the other test pad (e.g. test pad 216) to ground. In the conventional voltage ramp method, for example, a test voltage can be linearly increased (i.e. ramped up) at a substantially constant (i.e. fixed) step rate at test pad 214 with test pad 216 connected to ground. For example, the test voltage can be increased at each ramp step by approximately 1.0 volts. At each ramp step, a corresponding leakage current can be measured between the test pads (e.g. between test pads 214 and 216) after the test voltage has been increased. As the test voltage is increased, the leakage current between the test pads can also increase, thereby indicating an increase in leakage current in the dielectric layer under test.

In the conventional voltage ramp method, breakdown of the dielectric layer that is being tested in the test structure can be indicated by an abrupt change in leakage current flowing through the dielectric layer in response to an increase in test voltage. For example, a spike (i.e. an abrupt increase) in leakage current can indicate that the dielectric layer has broken down by forming a short. For example, an abrupt decrease in leakage current can indicate that the dielectric layer has broken down by forming an open. When the abrupt change in leakage current has been detected, the test voltage can be turned off. In the conventional voltage ramp method, the breakdown voltage of the dielectric layer under test can be designated as the value of the test voltage at the step corresponding to the abrupt change in leakage current.

Although dielectric breakdown voltage can be determined by utilizing the conventional voltage ramp method, it (i.e. the conventional voltage ramp method) causes a catastrophic failure of the dielectric layer, thereby causing a burn mark, such as burn mark 226 or 228, to form on the surface of the wafer overlying the test structure. However, debris from a burn mark can spill onto surrounding dies, such as dies 202 and 204, thereby contaminating the wafer. Since the burn mark causes uncertainty regarding the reliability of the dies on wafer, the wafer must be scraped, which undesirably increases manufacturing cost. Also, the conventional voltage ramp method can undesirably reduce manufacturing yield when the wafer comprises a product wafer, since the product wafer is unsuitable for further processing.

Figure 3:
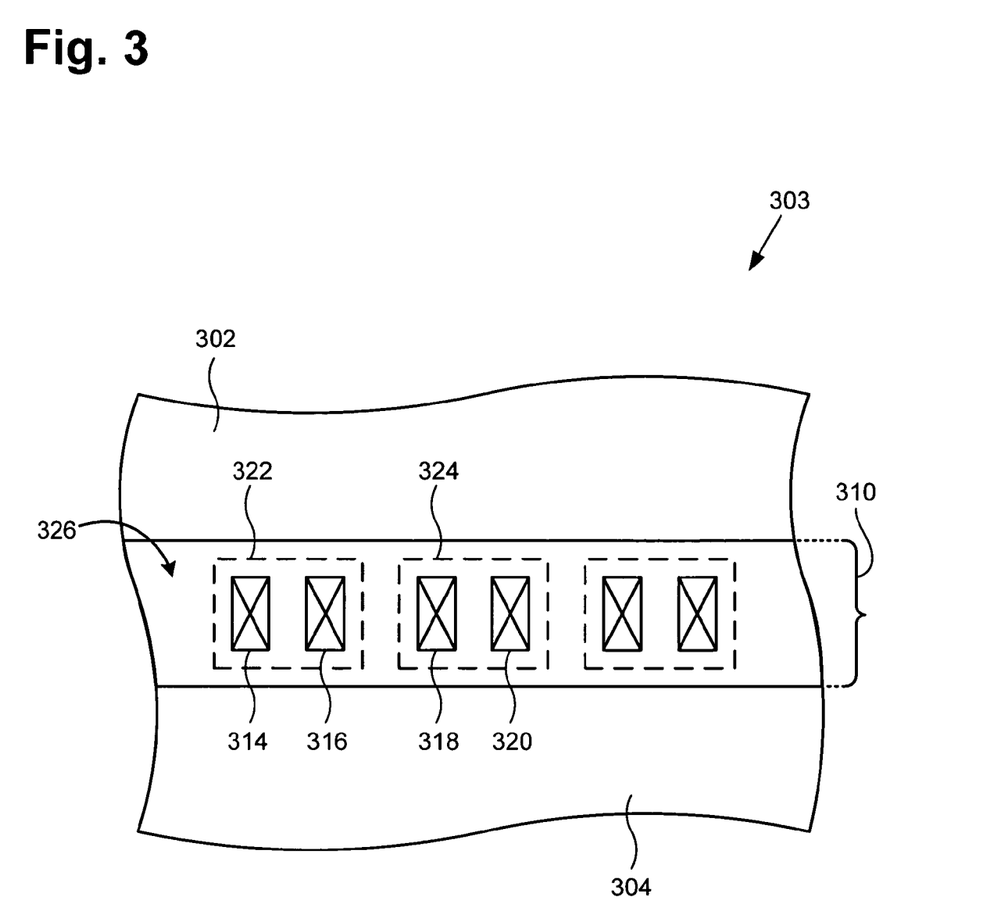
FIG. 3 shows a top view of a portion of the exemplary semiconductor wafer of FIG. 1 after dielectric breakdown voltage has been determined by an exemplary method in accordance with one embodiment of the present invention.

FIG. 3 shows a top view of a portion of wafer 100 in FIG. 1 after performing dielectric integrity testing utilizing an embodiment of the invention's current ramp dielectric breakdown method (hereinafter referred to simply as a "current ramp method"). In FIG. 3, wafer portion 303 corresponds to the portion of wafer 100 indicated by dashed line 103 in FIG. 1. In particular, dies 302 and 304 and dicing street 310 in FIG. 3 correspond, respectively, to dies 302 and 304 and dicing street 110 in FIG. 1. Dicing street 310 includes test pads 314, 316, 318, and 320, and test structures 322 and 324. It is noted that only test pads 314, 316, 318, and 320 and test structures 322 and 324 in FIG. 3 are discussed herein to preserve brevity.

As shown in FIG. 3, test pads 314, 316, 318, and 320 are situated on surface 326 of wafer portion 303 and test structures 322 and 324 are situated below surface 326 in dicing street 310 and situated over a semiconductor substrate (not shown in FIG. 3). In one embodiment, test structures 322 and 324 can be situated over a semiconductor substrate in a die, such as die 302 or die 304. In one embodiment, test structures 322 and 324 can be situated over a semiconductor substrate in a singulated die. Test pads 314 and 316 can be electrically connected to test structure 322 and test pads 318 and 320 can be electrically connected to test structure 324. Test pads 314, 316, 318, and 320 can each comprise copper, aluminum, or other suitable metal or metal stack. Test structure 322 can be utilized, for example, for determining inter-level dielectric layer breakdown voltage and can include a dielectric layer (not shown in FIG. 3) situated between metal segments (not shown in FIG. 3) in dicing street 310 in wafer portion 303. The metal segments in test structure 322 can be situated in adjacent metal layers (not shown in FIG. 3) in wafer portion 303 and can each be electrically connected to one of test pads 314 and 316.

Test structure 324 can be utilized, for example, for determining intra-level dielectric layer breakdown voltage in wafer portion 303 and can include a dielectric layer (not shown in FIG. 3) situated between adjacent metal segments (not shown in FIG. 3), which can be situated in a metal layer (not shown in FIG. 3) in the wafer. Each metal segment in test structure 324 can be electrically connected to one of test pads 318 and 320. In one embodiment, a dicing street, such as dicing street 310, can include a test structure for determining a breakdown voltage of a gate dielectric layer, such as a gate oxide layer. In such embodiment, the test structure can include a gate dielectric layer situated over a well formed in a substrate, a gate situated over the gate dielectric layer, spacers situated on opposing sides of the gate, and source/drain regions situated in the well adjacent to the gate. The source/drain regions can be electrically connected to one test pad, such as test pad 314, and the gate can be electrically connected to another test pad, such as test pad 316.

In an embodiment of the invention's current ramp method, a breakdown voltage of a dielectric layer in a test structure, such as test structure 322, that is connected to a pair of test pads, such as test pads 314 and 316, can be determined by injecting a current ramp (i.e. an increasing test current) into one test pad (e.g. test pad 314) and connecting the other test pad (e.g. test pad 316) to ground. The test current can be increased at each of a selected number of ramp steps per "decade ampere," where a "decade ampere" represents an increase in test current by a factor of ten. For example, a decade ampere can represent an increase in test current from 1.0 milliamperes to 10.0 milliamperes or from 10.0 microamperes to 100.0 microamperes. In one embodiment, the ramp steps of the test current can be substantially logarithmically increased. In another embodiment, the ramp steps of the test current can be substantially linearly increased. In one embodiment, the invention can utilize ten ramp steps per decade ampere. In other embodiments, a numbers of ramp steps greater than or less than ten ramp steps per decade ampere can be utilized. A ramp rate can be specified in decade amperes per unit of time. For example, a ramp rate of 0.1 decade amperes per second can be utilized in one embodiment. Thus, in an embodiment of the invention, a number of ramp steps per decade ampere and the duration of the decade ampere can each be specified. The duration of a decade ampere can be, for example, between 100.0 milliseconds and 20.0 seconds in one embodiment of the invention.

After the test current has been increased at a ramp step, a corresponding test voltage can be measured across the test pads (e.g. across test pads 314 and 316) that are connected to the test structure (e.g. test structure 322). The test voltage that is measured at each ramp step can correspond to the amount of test current injected into the dielectric layer at that ramp step. The initial level of test current that is injected into the dielectric layer via a test pad at the start of the invention's current ramp method can be selected to be at a sufficiently low level (i.e. a known safe level) so that it (i.e. the initial amount of test current) does not cause the dielectric layer to breakdown.

In an embodiment of the invention's current ramp method, as the test current is increased (i.e. ramped up) at each successive ramp step, the measured test voltage will also continue to increase. When a drop in measured test voltage (also referred to as a "dropped test voltage" in the present application) is first detected in response to an increase in test current at a particular ramp step, the drop in measured test voltage (i.e. the dropped test voltage) can indicate an onset of a dielectric breakdown, wherein the dielectric layer is beginning to weaken. At the onset of a drop in measured test voltage, the test current can be turned off to prevent further weakening of the dielectric layer. The breakdown voltage of the dielectric layer under test can be designated to be substantially equal to value of the test voltage that was measured at the ramp step at which the drop in test voltage (i.e. the dropped test voltage) was detected. By increasing the number of ramp steps per decade ampere, the resolution of an embodiment of the invention's current ramp method can be increased, thereby enabling a more accurate dielectric breakdown voltage to be determined.

By controlling the test current injected into a dielectric layer, an embodiment of the invention's current ramp method can determine a breakdown voltage of the dielectric layer without causing a catastrophic failure of the dielectric layer (i.e. destruction of the dielectric layer), thereby preventing a burn mark from forming on the surface of the wafer. As a result, a product wafer, such as wafer 100, can be utilized for production after dielectric breakdown voltage has been determined by utilizing an embodiment of the invention's current ramp method. In contrast, a conventional voltage ramp method for determining dielectric breakdown voltage as discussed in FIG. 2 results in destruction of the dielectric layer, which causes a burn mark to form on the wafer surface. Consequently, a product wafer, such as wafer 100, must be scrapped after a conventional voltage ramp method has been performed on the product wafer. Thus, an embodiment of the invention's current ramp method can result in an increased manufacturing yield compared to the conventional voltage ramp method for determining dielectric breakdown voltage. Also, in an embodiment in which the ramp steps of test current are substantially logarithmically increased, the invention's current ramp method can provide increased wafer throughput by reducing the time required to determine dielectric breakdown voltage.

Figure 4:
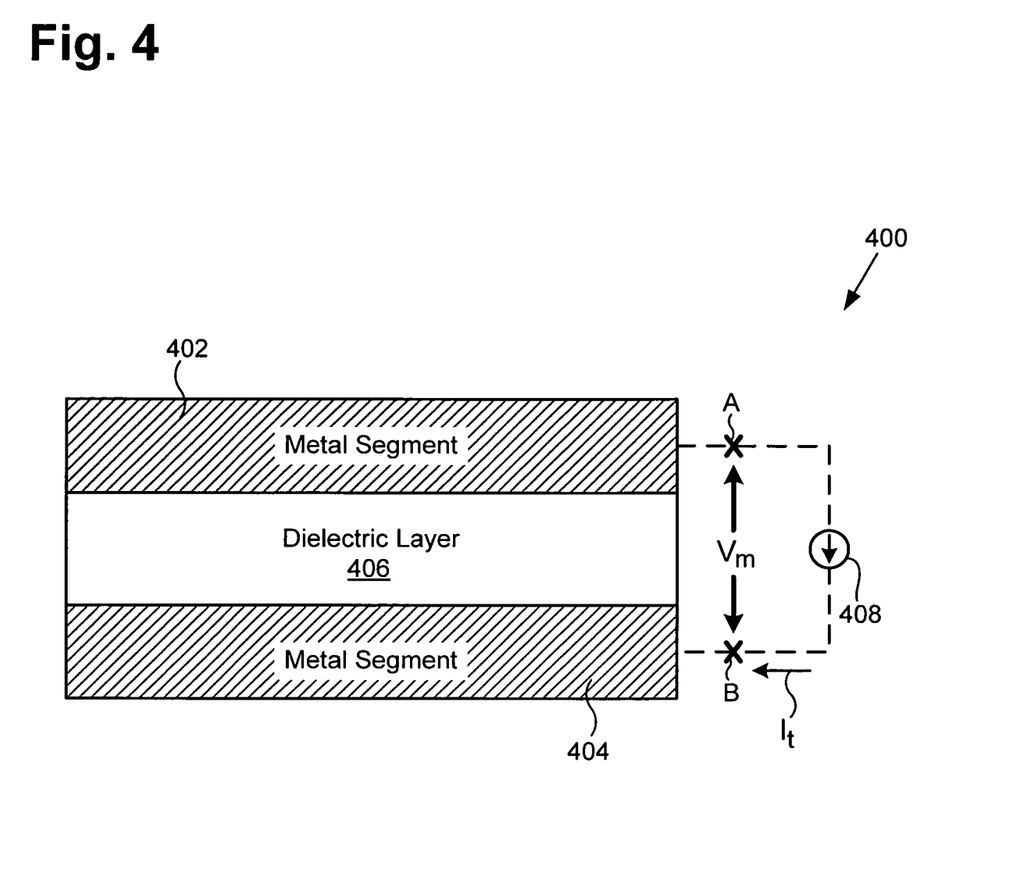
FIG. 4 shows a cross-sectional view of an exemplary test structure configured for determining breakdown voltage of an inter-level dielectric layer in accordance with one embodiment of the present invention.

FIG. 4 shows a cross-sectional view of an exemplary test structure for determining dielectric breakdown voltage by an embodiment of the invention's current ramp method. In FIG. 4, test structure 400 can correspond to test structure 322 or test structure 324 in FIG. 3. Test structure 400 includes metal segments 402 and 404 and dielectric layer 406. As shown in FIG. 4, dielectric layer 406 is situated over metal segment 404 and metal segment 402 is situated over dielectric layer 406. Metal segments 402 and 404 can each comprise, for example, copper, aluminum, or other metal or metal stack. Metal segment 404 can be situated in a metal layer in the wafer, such as a first metal layer (i.e. M1) or higher metal layer. Metal segment 402 can be situated in a higher metal layer in the wafer than the metal layer in which metal segment 404 is situated. For example, if metal segment 404 is situated in M1, metal segment 402 can be situated in a second metal layer (i.e. M2) in the wafer. For example, if metal segment 404 is situated in M2, metal segment 402 can be situated in a third metal layer (i.e. M3) in the wafer. Dielectric layer 406 can comprise silicon dioxide or other type of dielectric material, such as a low-k dielectric material.

In test structure 400, dielectric layer 406 forms an inter-level dielectric layer between metal segments 402 and 404.

Test structure 400 can be utilized to test inter-level dielectric layer integrity by utilizing an embodiment of the invention's current ramp method to determine a breakdown voltage of dielectric layer 406. To determine the breakdown voltage of dielectric layer 406, metal segments 402 and 404 can be coupled to respective test pads A and B, which can be situated on a top surface of a wafer, such as wafer 100 in FIG. 1. For example, test structure 400 can correspond to test structure 322 and test pads A and B can correspond to respective test pads 314 and 316, which are situated in wafer portion 303 in FIG. 3.

To utilize an embodiment of the invention's current ramp method to determine the dielectric breakdown voltage of dielectric layer 406, current source 408 can be coupled between test pads A and B. For example, current source 408 can be provided by a parametric analyzer in one embodiment. Current source 408 can provide a test current ($i_t$), which can be injected into dielectric layer 406 via test pad B and metal segment 404. Voltage $V_m$, which is the test voltage required to inject $i_t$ into dielectric layer 406, can be measured across test pads A and B. The test current ($i_t$) can be increased in increasing ramp steps at a selected ramp rate from an initial current level, which can be a safe current level (i.e. a known test current level that does not cause dielectric layer 406 to break down). In one embodiment, the test current ($i_t$) can be increased in substantially logarithmically increasing ramp steps. In another embodiment, the test current ($i_t$) can be increased in substantially linearly increasing ramp steps.

The ramp rate of $i_t$ can be selected by specifying a number of ramp steps per decade ampere (i.e. a number of steps of increased current required to cause the current to increase by a factor of ten) and a duration of a decade ampere. For example, a ramp rate of 0.1 decade ampere per second can be selected by specifying ten ramp steps per decade and a duration of ten seconds per decade ampere.

After $i_t$ has been increased at each ramp step, and $V_m$ can be measured between test pads A and B. When an onset of a decrease in test voltage $V_m$ (i.e. a dropped test voltage) is detected in response to a ramp step increase in $i_t$, current source 408 can be turned off to prevent test current $i_t$ from continuing to flowing through dielectric layer 406. The value of $V_m$ at the ramp step at which the onset of the decrease in $V_m$ was detected can be designated as the breakdown voltage of dielectric layer 406. Thus, an embodiment of the invention's current ramp method can be utilized to determine a breakdown voltage of an inter-level dielectric layer in a test structure, such as test structure 400.

Figure 5:
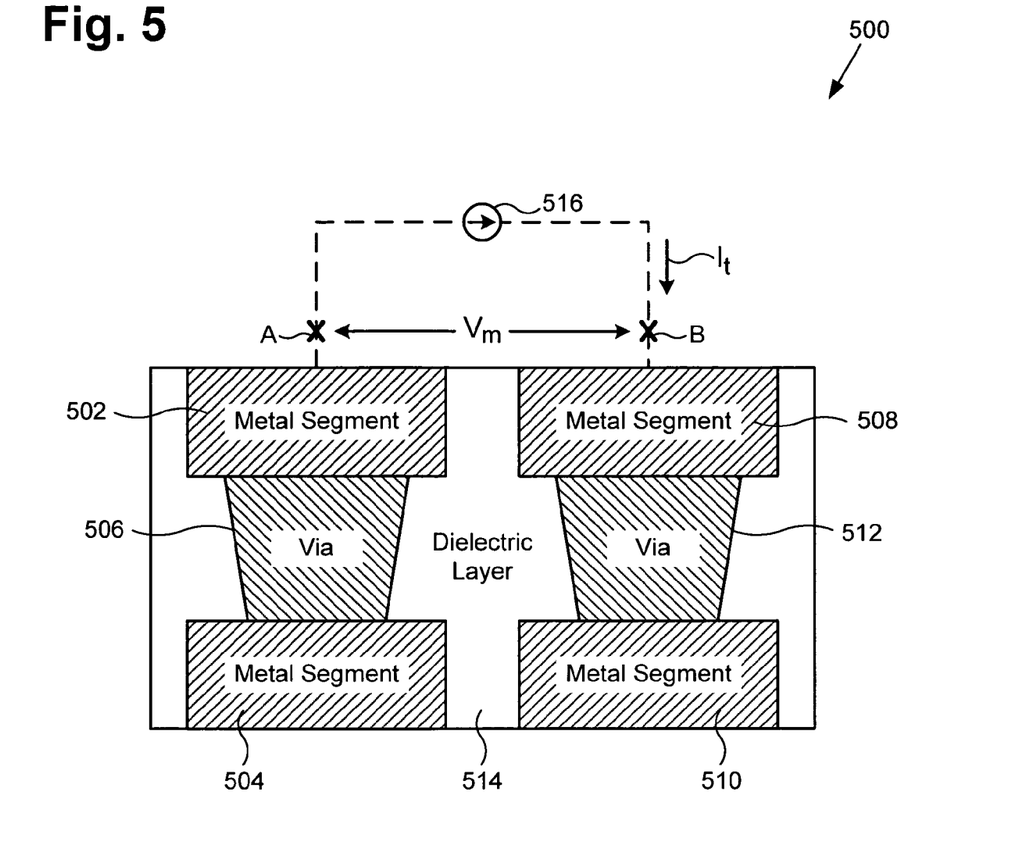
FIG. 5 shows a cross-sectional view of an exemplary test structure configured for determining breakdown voltage of an intra-level dielectric layer in accordance with one embodiment of the present invention.

FIG. 5 shows a cross-sectional view of an exemplary test structure for determining dielectric breakdown voltage by an embodiment of the invention's current ramp method. In FIG. 5, test structure 500 can correspond to test structure 322 or test structure 324 in FIG. 3. Test structure 500 includes metal segments 502, 504, 508, and 510, vias 506 and 512, and dielectric layer 514. As shown in FIG. 5, via 506 is situated between metal segments 502 and 504, via 512 is situated between metal segments 508 and 510, and dielectric layer 514 is situated between metal segments 502 and 508 and also situated between metal segments 504 and 510. Metal segments 502, 504, 508, and 510 can each can each comprise, for example, copper, aluminum, or other metal or metal stack. Vias 506 and 512 can comprise, for example, copper, aluminum, tungsten, or other metal or metal stack. Metal segments 504 and 510 can be situated in a metal layer, such as M1, M2, or higher metal layer in the wafer. Metal segments 502 and 508 can be situated in a higher metal layer in the wafer than metal segments 504 and 510. For example, if metal segments 504 and 510 are situated in M1, metal segments 502 and 508 can be situated in M2, and so forth. Dielectric layer 514 can comprise silicon dioxide or other type of dielectric material, such as a low-k dielectric material.

In test structure 500, dielectric layer 514 forms an intra-level dielectric layer between metal segments 504 and 510 and between metal segments 502 and 508. Test structure 500 can be utilized to test intra-level dielectric layer integrity by utilizing an embodiment of the invention's current ramp method to determine a breakdown voltage of dielectric layer 514. To determine the breakdown voltage of dielectric layer 514, metal segments 502 and 508 in test structure 500 can be coupled to respective test pads A and B, which can be situated on a top surface of wafer, such as wafer 100 in FIG. 1. For example, test structure 500 can correspond to test structure 322 and test pads A and B can correspond to respective test pads 314 and 316, which are situated in wafer portion 303 shown in FIG. 3.

To utilize an embodiment of the invention's current ramp method to determine the dielectric breakdown voltage of dielectric layer 514, current source 516 can be coupled between test pads A and B. For example, current source 516 can be provided by a parametric analyzer in one embodiment. Current source 516 can provide a test current ($i_t$), which can be injected into dielectric layer 514 by way of test pad B, metal segments 508 and 510, and via 512. Voltage $V_m$, which is the test voltage required to inject $i_t$ into dielectric layer 514, can be measured between test pads A and B. Test current ($i_t$) can be increased in increasing ramp steps at a selected ramp rate from an initial current level, which can be a safe current level (i.e. a known current level that does not cause dielectric layer 514 to break down). In one embodiment, the test current can be increased in substantially logarithmically increasing ramp steps. In another embodiment, the test current can be increased in substantially linearly increasing ramp steps. The ramp rate of $i_t$ can be selected by specifying a number of ramp steps per decade ampere and a duration of a decade ampere. For example, a ramp rate of 0.1 decade ampere per second can be selected by specifying ten ramp steps per decade and a ramp duration of ten seconds per decade ampere.

After $i_t$ has been increased at each ramp step, $V_m$ can be measured between test pads A and B. When an onset of a decrease in $V_m$ (i.e. a dropped test voltage) is detected in response to a ramp step increase in $i_t$, current source 516 can be turned off to prevent it from continuing to flow through dielectric layer 514. The value of $V_m$ at the ramp step at which the onset of the decrease in $V_m$ was detected can be designated as the breakdown voltage of dielectric layer 514. Thus, an embodiment of the invention's current ramp method can be utilized to determine a breakdown voltage of an intra-level dielectric layer in a test structure, such as test structure 500.

Figure 6:
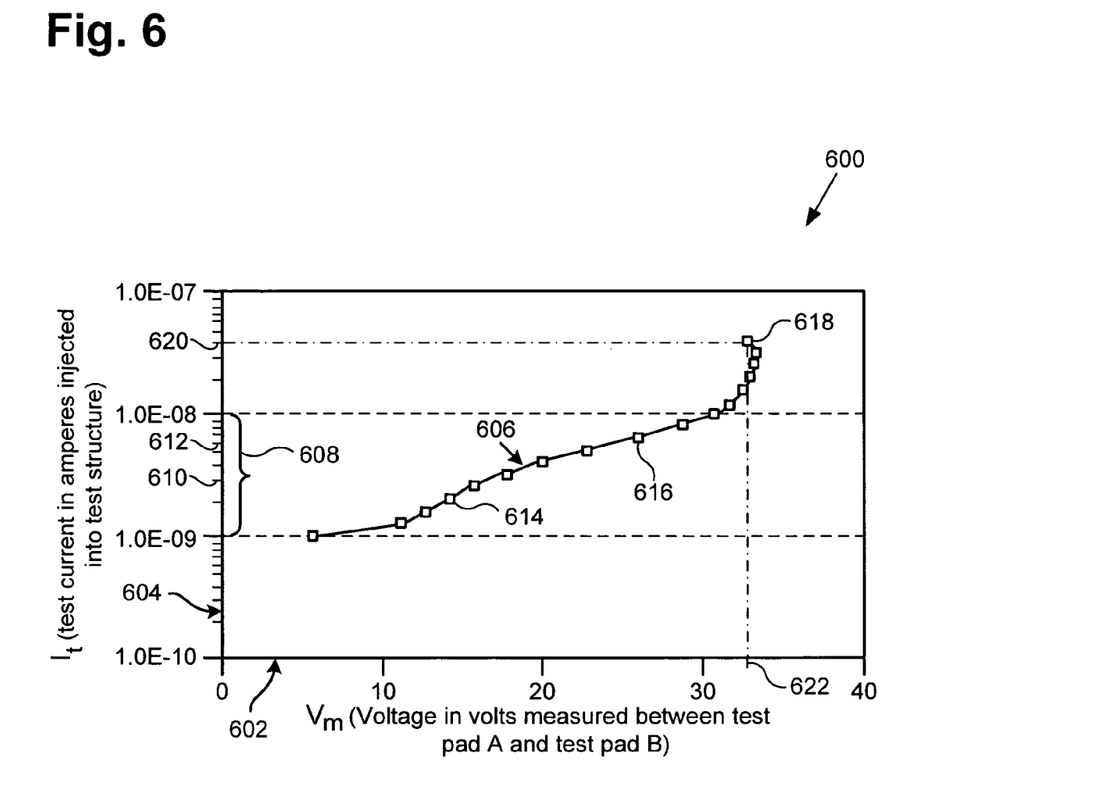
FIG. 6 is a graph showing an exemplary I-V curve for determining dielectric breakdown voltage in accordance with one embodiment of the present invention.

FIG. 6 shows graph 600 including an exemplary I-V curve in accordance with one embodiment of the present invention. Graph 600 includes $V_m$ (measured test voltage) axis 602, test current ($i_t$) axis 604, and I-V curve 606. Measured test voltage ($V_m$) axis 602 corresponds to an exemplary range of test voltages that can be measured between test pads, such as test pads A and B in FIG. 4 or 5, in a test structure, such as test structure 400 in FIG. 4 or test structure 500 in FIG. 5, to determine dielectric breakdown voltage by utilizing an embodiment of the invention's current ramp method. Test current axis 604 corresponds to an exemplary range of test currents that can be injected into a test structure, such as test structure 400 or test structure 500, to determine a dielectric breakdown voltage of a dielectric layer, such as dielectric layer 406 in test structure 440 or dielectric layer 514 in test structure 500, utilizing an embodiment of the invention's current ramp method. On test current axis 604, decade ampere 608 represents a substantially logarithmic increase in $i_t$ from 1.0E-09 amperes to 1.0E-08 amperes (i.e. a ten-fold increase in $i_t$). Decade ampere 608 can include, for example, ten ramp steps, such as ramp steps 610 and 612, in one embodiment of the invention.

In the example shown in graph 600, I-V curve 606 represents an exemplary relationship between $i_t$ (test current) and $V_m$ (measured test voltage) at each of a number of ramp steps, where an increased value of $i_t$ is injected into a dielectric layer in the test structure at each ramp step and a corresponding value of $V_m$ is measured between test pads A and B, which are coupled to the dielectric layer in the test structure. As shown in graph 600, I-V curve 606 includes a number of squares, such as squares 614, 616, and 618, where each square can represent a ramp step increase in $i_t$ and a corresponding value of $V_m$.

In the example shown in graph 600, square 618 on I-V curve 606 indicates an onset of a decrease in $V_m$ (i.e. a dropped test voltage) in response to an increase in $i_t$ at ramp step 620. The breakdown voltage of the dielectric layer that is coupled to test pads A and B, such as dielectric layer 406 in FIG. 4, can be designated to be substantially equal to the dropped test voltage (i.e. the value of $V_m$ that was measured in response to the increase in $i_t$ at ramp step 620).

Figure 7:
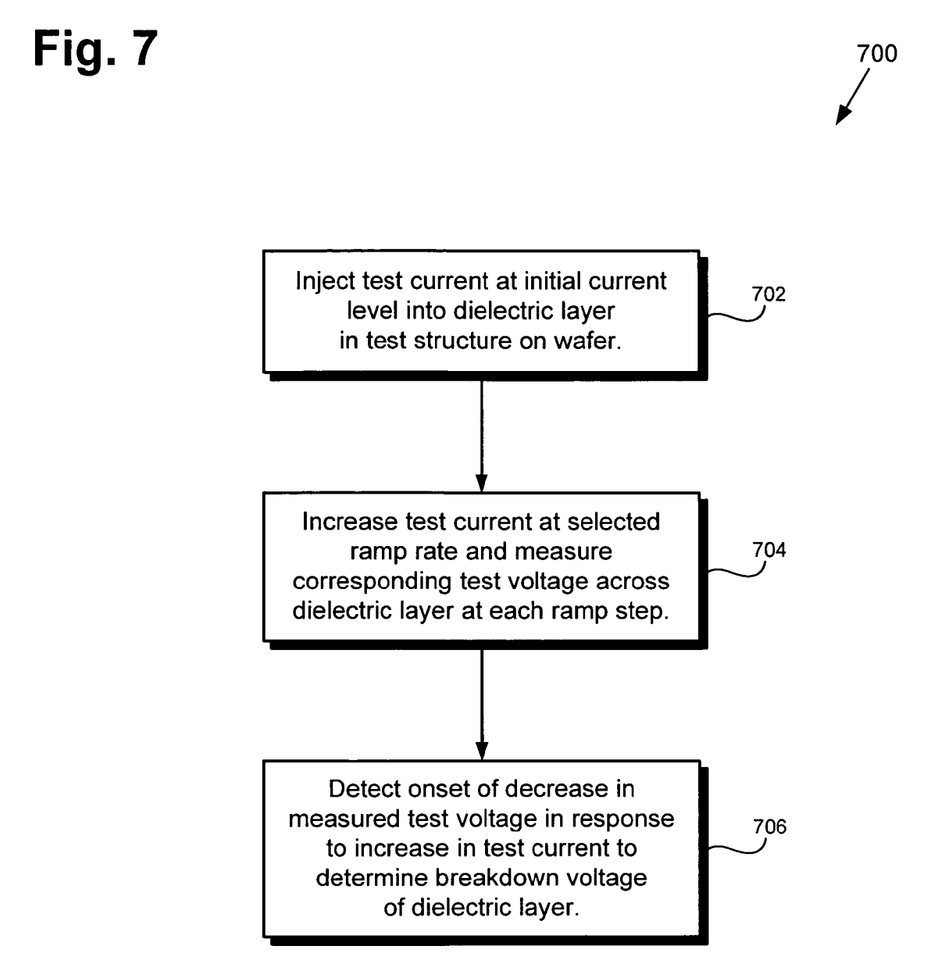
FIG. 7 is a flowchart illustrating an exemplary method for determining dielectric breakdown voltage in accordance with one embodiment of the present invention.

FIG. 7 is a flowchart illustrating an exemplary method for determining dielectric breakdown voltage according to one embodiment of the present invention. Certain details and features have been left out of flowchart 700 that are apparent to a person of ordinary skill in the art. For example, a step may consist of one or more substeps or may involve specialized equipment or materials, as known in the art. It is noted that the processing steps shown in flowchart 700 are performed on a portion of a wafer, which, prior to step 702 of flowchart 700, includes, among other things, semiconductor dies, such as dies 302 and 304 in wafer portion 303 in FIG. 3, dicing streets, such as dicing street 310, a test structure, such as test structure 400 in FIG. 4 or test structure 500 in FIG. 5, test pads, such as test pads A and B in FIGS. 4 and 5, and a dielectric layer, such as dielectric layer 406 in FIG. 4 or dielectric layer 514 in FIG. 5, where the dielectric layer is coupled to the test pads.

At step 702 of flowchart 700, a test current is injected at an initial current level into a dielectric layer, such as dielectric layer 406 in FIG. 4, in a test structure, such as test structure 400, on a wafer, such as wafer 100 in FIG. 1. For example, a test current ($i_t$) can be injected into dielectric layer 406 in test structure 400 by injecting the test current into test pad B, which is coupled to dielectric layer 406 via metal segment 404. For example, a test current ($i_t$) can be applied to dielectric layer 514 in test structure 500 in FIG. 5 by injecting the test current into test pad B, which is coupled to dielectric layer 514 by metal segment 508, via 512, and metal segment 510.

At step 704, the test current ($i_t$) can be increased at a selected ramp rate and a corresponding test voltage ($V_m$) can be measured across the dielectric layer at each increasing ramp step. For example, the test current ($i_t$) can be increased at a selected ramp rate substantially equal to 0.1 decade ampere per second in one embodiment. In one embodiment, the test current can be injected into the dielectric layer at substantially logarithmically increasing ramp steps. In another embodiment, the test current can be injected into the dielectric layer at substantially linearly increasing ramp steps. After a ramp step increase in the test current, the test voltage ($V_m$) corresponding to the increased test current can be measured across the dielectric layer, such as dielectric layer 406 in FIG. 4 or dielectric layer 514 in FIG. 5, by measuring the test voltage across the test pads, such as test pads A and B. Thus, the corresponding test voltage can be measured at each of the increasing ramp steps of the test current.

At step 706 of flowchart 700, an onset of a drop in measured test voltage (i.e. a dropped test voltage) can be detected in response to an increase in test current at a ramp step so as to determine the breakdown voltage of the dielectric layer, such as dielectric layer 406 in FIG. 4 or dielectric layer 514 in FIG. 5. When the decrease in measured test voltage is detected, the test current can be turned off to prevent further weakening of the dielectric layer. The breakdown voltage of the dielectric layer can be designated to be substantially equal to the dropped test voltage (i.e. the value of the measured test voltage at the ramp step at which the onset of the decrease in the measured test voltage was detected).

Figure 8:
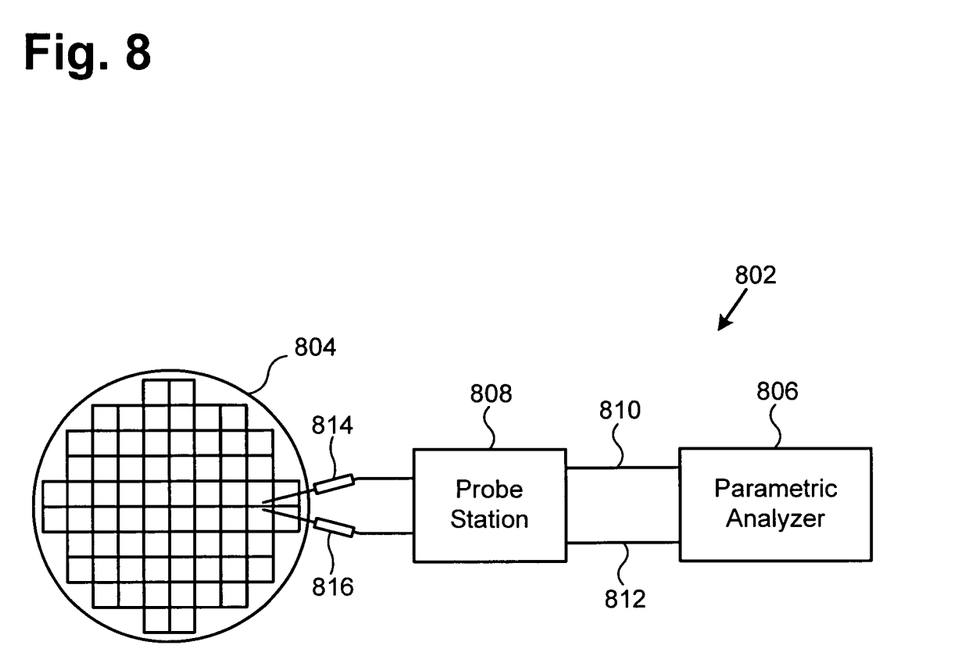
FIG. 8 shows a diagram of an exemplary test system for implementing an embodiment of the invention's method of determining dielectric breakdown voltage in a semiconductor wafer.

FIG. 8 shows a diagram of an exemplary test system for implementing an embodiment of the invention's method of determining dielectric breakdown voltage in a wafer. In FIG. 8, test system 802 can be, for example, a dielectric reliability test system and is coupled to wafer 804, which corresponds to wafer 100 in FIG. 1. In the embodiment shown, test system 802 includes automated (i.e. computerized) parametric analyzer 806 and probe station 808.

As shown in FIG. 8, parametric analyzer 806 is coupled to probe station 808 via lines 810 and 812. Parametric analyzer 806 can provide two outputs, which can be, for example, source measuring units. One of the source measuring units can provide a ground and the other source measuring unit can provide a test current, for example. Also shown in FIG. 8, probe station 808 provides probe pins 814 and 816, which can be coupled to test pads (not shown in FIG. 8), such as test pads A and B in FIG. 4 or FIG. 5, on wafer 804. The test pads can be coupled to a dielectric layer (not shown in FIG. 8), such as dielectric layer 406 in FIG. 4 or dielectric 514 in FIG. 5, situated in a test structure (not shown in FIG. 8), such as test structure 400 or test structure 500. The test structure can be situated in a dicing street on wafer 804, such as dicing street 310 in wafer portion 303 in FIG. 3.

Parametric analyzer 806 can be configured to implement an embodiment of the invention's current ramp method for determining dielectric breakdown voltage, such as an embodiment of the invention's current ramp method illustrated in flowchart 700 in FIG. 7. In one embodiment, parametric analyzer 806 can be configured to determine a breakdown voltage of a dielectric layer, such as dielectric layer 406, on wafer 804 by injecting a test current at an initial current level into the dielectric layer in the test structure, such as test structure 400. For example, parametric analyzer 806 can be configured to inject a test current into the dielectric layer by providing a test current to probe pin 814 and a ground to probe pin 816.

Parametric analyzer 806 can be further configured to increase the test current at a selected ramp rate and measure a corresponding test voltage across the dielectric layer at each ramp step. For example, parametric analyzer 806 can be configured to increase the test current at probe pin 814 at each ramp step while measuring the test voltage across the dielectric layer by measuring the test voltage between probe pins 814 and 816. In one embodiment, parametric analyzer 806 can be configured to increase the test current at a substantially logarithmic rate. Parametric analyzer 806 can be further configured to detect an onset of a decrease in measured test voltage across the dielectric layer in response to an increase in test current at a ramp step to determine a breakdown voltage of the dielectric layer. For example, parametric analyzer 806 can be configured to designate the dielectric breakdown voltage to be substantially equal to the value of the measured test voltage at the ramp step at which the onset of the decrease in measured test voltage was detected (i.e. the dropped test voltage). As such, test system 802 can be utilized to determine a dielectric breakdown voltage of a dielectric layer in a wafer by implementing an embodiment of the invention's current ramp method.

Thus, as discussed above, the invention provides a current ramp method for determining dielectric breakdown voltage of a dielectric layer on a wafer, wherein the dielectric breakdown voltage is determined without causing the wafer to be scrapped. In contrast, a conventional voltage ramp method for determining dielectric breakdown voltage causes a burn mark to be created on the surface of the wafer, thereby causing the wafer to be scrapped. Thus, since the invention's current ramp method determines dielectric breakdown voltage without causing the wafer to be scrapped, the invention's current ramp method reduces manufacturing cost compared to the conventional voltage ramp method.

Also, the invention's current ramp method can increase manufacturing yield by enabling further processing of a product wafer after determination of dielectric breakdown voltage. Furthermore, by utilizing a substantially logarithmic current ramp, an embodiment of the invention's current ramp method for determining dielectric breakdown voltage can provide an increased wafer throughput.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

The invention claimed is:

1. A non-destructive method for determining a breakdown voltage of a dielectric layer on a semiconductor substrate, said method comprising:
    injecting in increasing ramp steps a test current into said dielectric layer;
    measuring a test voltage directly across said dielectric layer at each said increasing ramp steps of said test current;
    detecting a dropped test voltage in response to said increasing ramp steps of said test current;
    discontinuing injecting said test current immediately upon an onset of said dropped test voltage, wherein said test current is not injected into said dielectric layer after said onset of said dropped test voltage to prevent damage to said dielectric layer; and
    designating said breakdown voltage to be substantially equal to said dropped test voltage.

2. The method of claim 1, wherein said ramp steps of said test current are substantially logarithmically increased.

3. The method of claim 1, wherein said ramp steps of said test current are substantially linearly increased.

4. The method of claim 1, wherein said dielectric layer and said semiconductor substrate are situated in a test structure on a wafer.

5. The method of claim 4, wherein said dropped test voltage is determined without causing a burn mark on said wafer.

6. The method of claim 4, wherein said breakdown voltage of said dielectric layer is determined without causing a burn mark on said wafer.

7. The method of claim 1, wherein said dielectric layer is situated in a test structure in a dicing street on a wafer.

8. The method of claim 4, wherein said wafer is usable for production after said breakdown voltage of said dielectric layer has been determined.

9. A non-destructive method for determining a breakdown voltage of a dielectric layer situated in a test structure in a dicing street on a wafer, said dielectric layer coupled between first and second test pads on said wafer, said method comprising:
    injecting in increasing ramp steps a test current into said first test pad;
    measuring a test voltage directly across said dielectric layer between said first and second test pads at each said increasing ramp steps of said test current;
    discontinuing injecting said test current immediately upon an onset of a dropped test voltage, wherein said test current is not injected into said dielectric layer after said onset of said dropped test voltage to prevent damage to said dielectric layer, said dropped test voltage occurring in response to said increasing ramp steps of said test current;
    designating said breakdown voltage of said dielectric layer in said test structure in said dicing street on said wafer to be substantially equal to said measured dropped test voltage.

10. The method of claim 9, wherein said breakdown voltage of said dielectric layer is determined without causing a burn mark on said wafer.

11. The method of claim 9, wherein said ramp steps of said test current are substantially logarithmically increased.

12. The method of claim 9, wherein said ramp steps of said test current are substantially linearly increased.

13. The method of claim 9, wherein said wafer is usable for production after said breakdown voltage of said dielectric layer has been determined.

14. A test system for testing a wafer having a dielectric layer situated in a test structure, said test system configured to implement a non-destructive method for determining a breakdown voltage of said dielectric layer, said method comprising:
    injecting in increasing ramp steps a test current into said dielectric layer;
    measuring a test voltage directly across said dielectric layer at each said increasing ramp steps of said test current;
    detecting a dropped test voltage in response to said increasing ramp steps of said test current;
    discontinuing injecting said test current immediately upon an onset of said dropped test voltage, wherein said test current is not injected into said dielectric layer after said onset of said dropped test voltage to prevent damage to said dielectric layer; and
    designating said breakdown voltage to be substantially equal to said dropped test voltage.

15. The test system of claim 14, wherein said ramp steps of said test current are substantially logarithmically increased.

16. The test system of claim 14, wherein said ramp steps of said test current are substantially linearly increased.

17. The test system of claim 14, wherein said dropped test voltage is determined without causing a burn mark on said wafer.

18. The test system of claim 17, wherein said wafer is usable for production after said breakdown voltage of said dielectric layer has been determined.

* * * * *